(12) United States Patent
Takahashi

(10) Patent No.: US 9,991,974 B2
(45) Date of Patent: Jun. 5, 2018

(54) TRANSMITTER, INTEGRATED CIRCUIT, DETECTION SECTION AND METHOD FOR TESTING INTEGRATED CIRCUIT

(71) Applicant: Mitsubishi Electric Corporation, Tokyo (JP)

(72) Inventor: Yoshinori Takahashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days. days.

(21) Appl. No.: 15/453,422

(22) Filed: Mar. 8, 2017

(65) Prior Publication Data

US 2018/0069641 A1 Mar. 8, 2018

(30) Foreign Application Priority Data

Sep. 6, 2016 (JP) ................. 2016-173631

(51) Int. Cl.
*G01R 31/02* (2006.01)
*H04B 17/00* (2015.01)
*H04B 17/16* (2015.01)
*G01R 31/28* (2006.01)
*G01R 31/317* (2006.01)

(52) U.S. Cl.
CPC ......... *H04B 17/16* (2015.01); *G01R 31/2822* (2013.01); *G01R 31/2851* (2013.01); *G01R 31/317* (2013.01); *G01R 31/31716* (2013.01)

(58) Field of Classification Search
CPC .......... G01R 31/317–31/3177; G01R 31/2822–31/2898; H04B 17/16

USPC .............................. 455/115.1, 126
See application file for complete search history.

(56) References Cited

U.S. PATENT DOCUMENTS

| | | | | |
|---|---|---|---|---|
| 5,371,481 A | * | 12/1994 | Tiittanen | ................ H03C 3/406 332/103 |
| 5,892,397 A | * | 4/1999 | Belcher | ................ H03F 1/3229 330/136 |
| 7,501,888 B2 | * | 3/2009 | Dauphinee | ......... G01R 31/2607 330/129 |

(Continued)

FOREIGN PATENT DOCUMENTS

JP 2002-232498 A 8/2002
JP 2006-134963 A 5/2006

(Continued)

*Primary Examiner* — Duc M Nguyen
(74) *Attorney, Agent, or Firm* — Studebaker & Brackett PC

(57) ABSTRACT

An integrated circuit according to the present invention includes a transmission circuit that transmits a millimeter wave signal, a detection section that detects the millimeter wave signal, an output terminal connected to an output of the transmission circuit via a first wire, a detection terminal provided adjacent to the output terminal and connected to an input of the detection section via a second wire, a first grounding terminal provided adjacent to the output terminal and connected to the transmission circuit via a first grounding wire for grounding the transmission circuit and a second grounding terminal provided adjacent to the detection terminal and connected to the detection section via a second grounding wire for grounding the detection section, wherein the first grounding wire and the second grounding wire are arranged around the first wire and the second wire.

11 Claims, 6 Drawing Sheets

(56) References Cited

U.S. PATENT DOCUMENTS

| | | | | |
|---|---|---|---|---|
| 7,904,033 | B1* | 3/2011 | Wright | H01Q 1/243 |
| | | | | 375/297 |
| 8,094,033 | B2* | 1/2012 | Dauphinee | G01R 31/31723 |
| | | | | 324/105 |
| 2002/0085647 | A1* | 7/2002 | Oishi | H03F 1/3247 |
| | | | | 375/297 |
| 2005/0130610 | A1* | 6/2005 | Scheck | H03C 3/406 |
| | | | | 455/126 |
| 2005/0271161 | A1* | 12/2005 | Staszewski | H03F 1/0205 |
| | | | | 375/308 |
| 2012/0025790 | A1* | 2/2012 | Noguchi | G01R 31/31721 |
| | | | | 323/265 |
| 2012/0126821 | A1 | 5/2012 | Forstner | |
| 2012/0207030 | A1* | 8/2012 | Luong | H04W 24/06 |
| | | | | 370/245 |
| 2013/0234741 | A1* | 9/2013 | Mow | H01Q 1/243 |
| | | | | 324/750.01 |
| 2013/0257454 | A1* | 10/2013 | Mow | H01Q 9/0421 |
| | | | | 324/619 |

FOREIGN PATENT DOCUMENTS

| | | |
|---|---|---|
| JP | 2012-112962 A | 6/2012 |
| JP | 2014-135682 A | 7/2014 |

\* cited by examiner

TRANSMITTER, INTEGRATED CIRCUIT, DETECTION SECTION AND METHOD FOR TESTING INTEGRATED CIRCUIT

BACKGROUND OF THE INVENTION

Field

The present invention relates to a transmitter, an integrated circuit, a detection section and a method for testing the integrated circuit

Background

JP 2006-134963 A discloses a receiving apparatus. A high frequency signal generation section and an input end of a received signal channel provided for this receiving apparatus are connected together via a disconnectable wire formed on a wafer. During testing in a wafer stage, the high frequency signal generation section generates a high frequency signal for testing. The high frequency signal is sent to the input end of the received signal channel and outputted from the receiving apparatus. A testing apparatus outside the receiving apparatus receives the output signal and performs various types of testing processing.

Radio communication apparatuses and radar apparatuses generally use high frequency signals in a microwave to millimeter-wave range as carriers. Semiconductor integrated circuits may be used as means for generating carriers. Defective products may be mixed in such integrated circuits. Manufacturing variations may cause variations in characteristics of those semiconductor integrated circuits. For this reason, it is necessary to conduct testing in a shipment step of the semiconductor integrated circuits, and function testing and an adjustment step after mounting of the semiconductor integrated circuits.

During testing in the shipment step of a semiconductor integrated circuit, testing is generally conducted by causing terminals of the semiconductor integrated circuit to contact a contact probe. The contact of the probe with the terminals is secured by positioning in a length direction. For this reason, the contact probe may be structured to move in the length direction. In this case, the contact probe may have a large parasitic inductance component. Therefore, it may be difficult to conduct accurate testing in a high frequency region of submillimeter wave and millimeter wave.

For this reason, high frequency probes are generally used for testing of the high frequency region. The high frequency probes may be expensive. Furthermore, the high frequency probes may have difficulty in handling multi-terminal packages such as BGA (Ball Grid Array). Furthermore, testing may require a special measuring system. This results in a problem of causing testing cost to increase.

A method of conducting testing with a testing circuit incorporated in the semiconductor integrated circuit may be considered to reduce the testing cost. This method causes the semiconductor integrated circuit to generate a high frequency signal for testing and conducts the testing. This method cannot test actual terminal output results of the semiconductor integrated circuit.

Furthermore, in order to enhance an operating speed with a silicon-based device, its gate length may be shortened and its base thickness may be reduced. This causes its withstand voltage to decrease. Therefore, it may be difficult to output high transmission power. Furthermore, when high transmission power is outputted, power load efficiency may decrease. For this reason, a high efficiency gallium arsenide (GaAs)-based HPA (High Power Amplifier) which is suitable for high transmission power may be required. In this case, a semiconductor integrated circuit formed of silicon and an HPA formed of GaAs may be assembled into a module and used. Here, the testing circuit incorporated in the semiconductor integrated circuit can test only the inside of the semiconductor integrated circuit but cannot test the part formed of GaAs. For this reason, only the silicon-based device can be tested and there is a problem that it is not possible to test the whole module.

According to the method shown in JP 2006-134963 A, when a short-wavelength signal such as a millimeter wave is used as a testing signal, the testing wire formed on the wafer may be longer than the wavelength of the testing signal. For this reason, the testing accuracy may deteriorate due to mismatch of wiring impedance. Furthermore, in assembly and testing process, the testing wire is disconnected. After the disconnection, the design of the module may be difficult due to impedance of the remaining wire. Furthermore, when the terminal is separate from the edge of the chip as in the case of a BGA package, the wiring length may be greater. For this reason, the influence of the wiring impedance is assumed to increase.

SUMMARY

The present invention has been implemented to solve the above-described problems and it is an object of the present invention to provide a transmitter, an integrated circuit, a detection section and a method for testing the integrated circuit capable of improving testing accuracy.

The features and advantages of the present invention may be summarized as follows.

According to the first invention, an integrated circuit includes a transmission circuit that transmits a millimeter wave signal, a detection section that detects the millimeter wave signal, an output terminal connected to an output of the transmission circuit via a first wire, a detection terminal provided adjacent to the output terminal and connected to an input of the detection section via a second wire, a first grounding terminal provided adjacent to the output terminal and connected to the transmission circuit via a first grounding wire for grounding the transmission circuit and a second grounding terminal provided adjacent to the detection terminal and connected to the detection section via a second grounding wire for grounding the detection section, wherein the first grounding wire and the second grounding wire are arranged around the first wire and the second wire.

According to the second invention, a detection section includes a distributor that distributes a millimeter wave signal, a detector connected to one output of the distributor to measure power of the millimeter wave signal and a quadrature mixer connected to another output of the distributor.

According to the third invention, a method for testing an integrated circuit, the integrated circuit includes a transmission circuit that transmits a millimeter wave signal, a detection section that detects the millimeter wave signal, an output terminal connected to an output of the transmission circuit via a first wire a detection terminal provided adjacent to the output terminal and connected to an input of the detection section via a second wire, a first grounding terminal provided adjacent to the output terminal and connected to the transmission circuit via a first grounding wire for grounding the transmission circuit; and a second grounding terminal provided adjacent to the detection terminal and connected to the detection section via a second grounding wire for grounding the detection section, wherein the first grounding wire and the second grounding wire are arranged around the first wire and the second wire, the method includes the steps of connecting the output terminal and the detection terminal via a high frequency transmission line provided on a contact probe and connecting the first grounding terminal and the second grounding terminal via a third grounding wire provided in the contact probe and provided around the high frequency transmission line.

Other and further objects, features and advantages of the invention will appear more fully from the following description.

DESCRIPTION OF EMBODIMENTS

Figure 1:
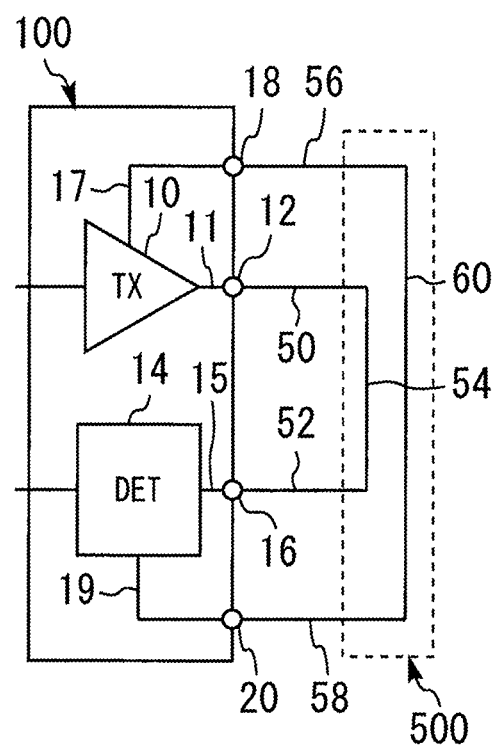
FIG. 1 is a circuit block diagram of an integrated circuit and a millimeter wave contact probe according to a first embodiment.

A transmitter, an integrated circuit, a detection section and a method for testing the integrated circuit according to an embodiment of the present invention will be described with reference to the accompanying drawings. Components identical or corresponding to each other are indicated by the same reference characters, and repeated description of them is avoided in some cases.

First Embodiment

FIG. 1 is a circuit block diagram of an integrated circuit and a millimeter wave contact probe according to a first embodiment. FIG. 1 illustrates statuses of an integrated circuit 100 and a millimeter wave contact probe 500 during testing. The integrated circuit 100 according to the present embodiment is provided with a transmission circuit 10. The transmission circuit 10 is a circuit that transmits a millimeter wave signal. The transmission circuit 10 is provided with an oscillator and an amplifier. The transmission circuit 10 includes functions of generating and amplifying a millimeter wave signal.

The transmission circuit 10 need not be provided with any oscillator. In this case, the transmission circuit 10 includes a function of amplifying a millimeter wave signal. The transmission circuit 10 may not include any amplifier either. In this case, the transmission circuit 10 includes a function of generating a millimeter wave signal. The integrated circuit 100 is provided with a detector 14. In the present embodiment, the detection section is the detector 14. The detector 14 detects a millimeter wave signal. The detector 14 measures power of the millimeter wave signal.

An output of the transmission circuit 10 is connected to an output terminal 12 via a first wire 11. An input of the detector 14 is connected to a detection terminal 16 via a second wire 15. The output terminal 12 and the detection terminal 16 are provided adjacent to each other. The output terminal 12 and the detection terminal 16 are terminals adjacent to each other on a package.

A first grounding terminal 18 is a terminal for grounding the transmission circuit 10. The transmission circuit 10 is connected to the first grounding terminal 18 via a first grounding wire 17. The first grounding terminal 18 is provided adjacent to the output terminal 12. A second grounding terminal 20 is a terminal for grounding the detector 14. The detector 14 is connected to the second grounding terminal 20 via a second grounding wire 19. The second grounding terminal 20 is provided adjacent to the detection terminal 16. The first grounding wire 17 and the second grounding wire 19 are arranged around the first wire 11 and the second wire 15. The first grounding wire 17 and the second grounding wire 19 are adjusted so as to obtain matching in a millimeter wave frequency band.

The millimeter wave contact probe 500 according to the present embodiment is provided with an output contact 50 and a detection contact 52. The output contact 50 is short-circuited to the detection contact 52 by a high frequency transmission line 54. Furthermore, the millimeter wave contact probe 500 is provided with a grounding contact 56 and a grounding contact 58. The grounding contact 56 is connected to the grounding contact 58 via a third grounding wire 60. The third grounding wire 60 is provided around the high frequency transmission line 54.

The output contact 50 is connected to the output terminal 12 during testing of the integrated circuit 100. The detection contact 52 is connected to the detection terminal 16. In this way, the output terminal 12 is connected to the detection terminal 16 via the high frequency transmission line 54. Furthermore, the grounding contact 56 is connected to the first grounding terminal 18. The grounding contact 58 is connected to the second grounding terminal 20. Thus, the first grounding terminal 18 and the second grounding terminal 20 are connected together by the third grounding wire 60.

Figure 2:
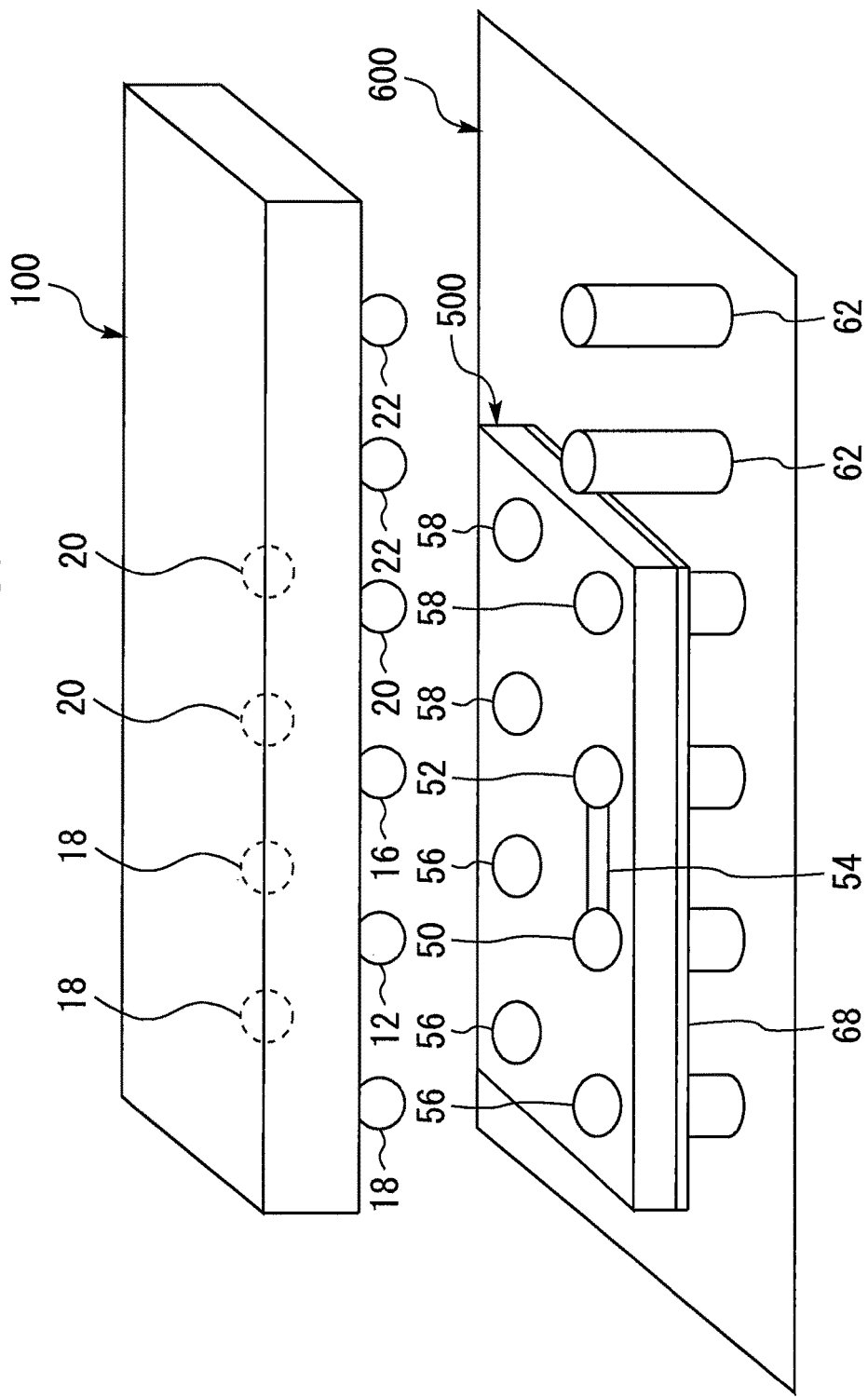
FIG. 2 is a perspective view of the integrated circuit and the contact probe according to the first embodiment.

FIG. 2 is a perspective view of the integrated circuit and the contact probe according to the first embodiment. The integrated circuit 100 according to the present embodiment is provided with a BGA package. The integrated circuit 100 is provided with terminals on a bottom surface of the package. In the present embodiment, a plurality of first grounding terminals 18 are provided around the output terminal 12. A plurality of second grounding terminals 20 are provided around the detection terminal 16. In the present embodiment, three first grounding terminals 18 and three second grounding terminals 20 are provided but the number of the first grounding terminals 18 and the number of the second grounding terminals 20 are not limited to three. Furthermore, the integrated circuit 100 is provided with low frequency terminals 22. The low frequency terminals 22 are terminals for low frequency signals.

A contact probe 600 according to the present embodiment is provided with the millimeter wave contact probe 500 and low frequency contact probes 62. The low frequency contact probes 62 are contact probes for low frequency signals. During testing of the integrated circuit 100, the low frequency contact probes 62 are connected to the low frequency terminals 22.

A plurality of millimeter wave signal contacts are formed on a top surface of the millimeter wave contact probe 500. The millimeter wave signal contacts include the output contact 50, the detection contact 52, the grounding contacts 56, and the grounding contacts 58. The plurality of grounding contacts 56 are provided around the output contact 50. The plurality of grounding contacts 58 are provided around the detection contact 52. The present embodiment provides the three grounding contacts 56 and the three grounding contacts 58, but the number of the grounding contacts 56 and the number of the grounding contacts 58 are not limited to three. During testing of the integrated circuit 100, the grounding contacts 56 are connected to their respective first grounding terminals 18. Furthermore, the grounding contacts 58 are connected to their respective second grounding terminals 20.

On the top surface of the millimeter wave contact probe 500, the output contact 50 and the detection contact 52 are short-circuited via the high frequency transmission line 54. A grounding wire 68 is provided on the back of the millimeter wave contact probe 500. The respective grounding contacts 56 and grounding contacts 58 are connected to the grounding wire 68.

Figure 3:
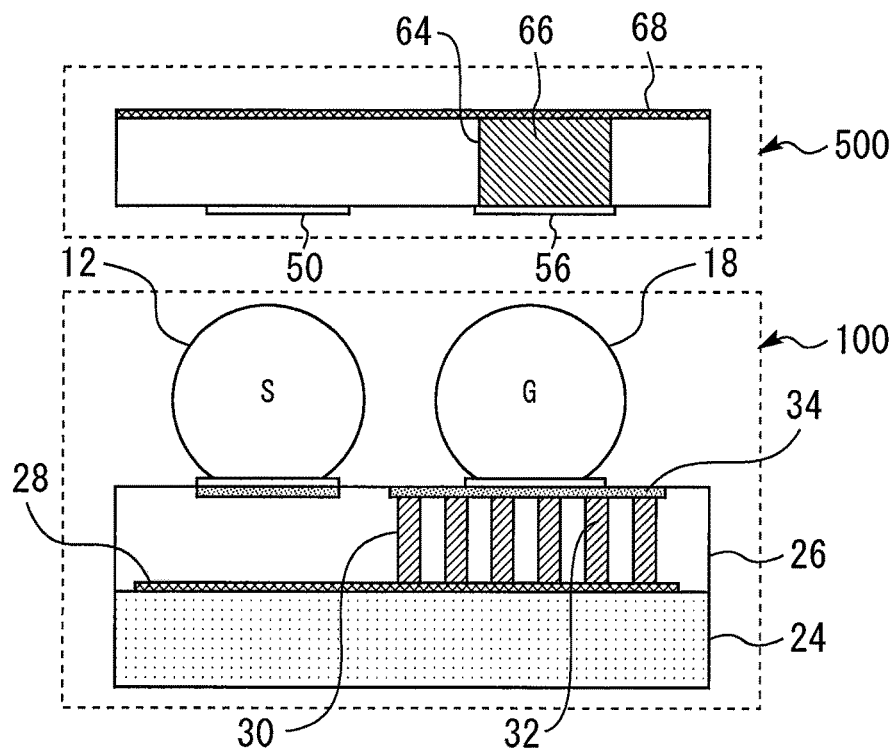
FIG. 3 is a cross-sectional view of the integrated circuit and the millimeter wave contact probe according to the first embodiment.

FIG. 3 is a cross-sectional view of the integrated circuit and the millimeter wave contact probe according to the first embodiment. FIG. 3 is an enlarged view of the vicinity of the output terminal 12 and the first grounding terminal 18. The integrated circuit 100 is provided with a FEOL (Front End Of Line) layer 24. The FEOL layer 24 is a layer in which a semiconductor device such as a transistor is formed. The semiconductor devices provided for the transmission circuit 10 and the detector 14 are formed on the FEOL layer 24.

A wiring layer 26 is formed on a top surface of the FEOL layer 24. The first wire 11, the second wire 15, the first grounding wire 17 and the second grounding wire 19 are formed in the wiring layer 26. The output terminal 12, the detection terminal 16, the first grounding terminal 18 and the second grounding terminal 20 are arranged on a top surface of the wiring layer 26. The output terminal 12, the detection terminal 16, the first grounding terminal 18 and the second grounding terminal 20 are solder bumps. The output terminal 12 and the detection terminal 16 are connected to the FEOL layer 24 via the wiring layer 26.

A lower grounding wire 28 is formed on a top surface of the FEOL layer 24 in the wiring layer 26. A plurality of upper grounding wires 34 are formed on the top surface side of the wiring layer 26. One of the first grounding terminals 18 and the second grounding terminals 20 is provided on each of the upper grounding wires 34. Through holes 30 are formed between the lower grounding wire 28 and each of the upper grounding wires 34 in the wiring layer 26. An intermediate grounding wire 32 is provided in the through hole 30. The lower grounding wire 28 and the upper grounding wire 34 are connected together via the intermediate grounding wire 32.

The lower grounding wire 28, the upper grounding wire 34 formed below the first grounding terminal 18 and the intermediate grounding wire 32 formed below the first grounding terminal 18 form the first grounding wire 17. Similarly, the lower grounding wire 28, the upper grounding wire 34 formed below the second grounding terminal 20 and the intermediate grounding wire 32 formed below the second grounding terminal 20 form the second grounding wire 19. Furthermore, the first wire 11 is formed between the output terminal 12 and the FEOL layer 24. The second wire 15 is formed between the detection terminal 16 and the FEOL layer 24.

Here, the output terminal 12 and the first grounding terminal 18 are provided adjacent to each other. Furthermore, the detection terminal 16 and the second grounding terminal 20 are provided adjacent to each other. Thus, the first grounding wire 17 and the second grounding wire 19 are arranged around the first wire 11 and the second wire 15. Furthermore, the lower grounding wire 28 is arranged below the output terminal 12 and the detection terminal 16. As described above, the first grounding wire 17 and the second grounding wire 19 are arranged around and below the first wire 11 and the second wire 15 that transmit a millimeter wave signal.

The millimeter wave contact probe 500 is provided with the grounding wire 68 on its top surface. The grounding wire 68 covers the top surface of the millimeter wave contact probe 500. A through hole 64 is provided between the grounding contact 56 and the grounding wire 68. Similarly, the through hole 64 is provided between the grounding contact 58 and the grounding wire 68. A grounding wire 66 is disposed in the through hole 64. The grounding wire 68 and the grounding contact 56 are connected together by the grounding wire 66. Similarly, the grounding wire 68 and the grounding contact 58 are connected together by the grounding wire 66.

The grounding wire 66 and the grounding wire 68 form the third grounding wire 60. Here, the output contact 50 and the grounding contact 56 are arranged adjacent to each other. Furthermore, the detection contact 52 and the grounding contact 58 are arranged adjacent to each other. The high frequency transmission line 54 is formed between the output contact 50 and the detection contact 52. As described above, the third grounding wire 60 is disposed around and above the high frequency transmission line 54.

During testing of the integrated circuit 100, the contact probe 600 and the integrated circuit 100 are connected together. At this time, a grounding wire is disposed around the first wire 11, the output terminal 12, the output contact 50, the high frequency transmission line 54, the detection contact 52, the detection terminal 16 and the second wire 15, which become a transmission line for a millimeter wave signal. This structure can prevent a millimeter wave signal from leaking to the outside. Therefore, it is possible to prevent impedance mismatch and loss of signals during testing of the integrated circuit 100. It is thereby possible to improve the testing accuracy.

In the present embodiment, the integrated circuit 100 and the contact probe 600 are connected together during testing. At this time, the output terminal 12 and the detection terminal 16 are short-circuited by the high frequency transmission line 54. For this reason, the output signal of the transmission circuit 10 can be measured by the detector 14. At this time, no external measuring instrument for measuring a high frequency signal is necessary. It is thereby possible to reduce testing cost.

The millimeter wave contact probe 500 according to the present embodiment is formed by short-circuiting the output contact 50 and the detection contact 52 via the high frequency transmission line 54. Thus, testing can be conducted using the millimeter wave contact probe 500 of a simple structure. Therefore, the testing cost can be reduced. Furthermore, in the present embodiment, an output signal of the transmission circuit 10 is detected by the detector 14. Therefore, an actual output signal of the integrated circuit 100 can be tested. It is thereby possible to conduct testing accurately.

In the present embodiment, testing is conducted by connecting the output terminal 12 and the detection terminal 16 via the high frequency transmission line 54. The high frequency transmission line 54 is formed on the surface of the millimeter wave contact probe 500 on which the output contact 50 and the detection contact 52 are provided. This structure can shorten the wiring length between the output terminal 12 and the detection terminal 16 during testing. Therefore, influences of impedance of wiring can be reduced. Thus, it is possible to improve accuracy of testing.

Second Embodiment

Figure 4:
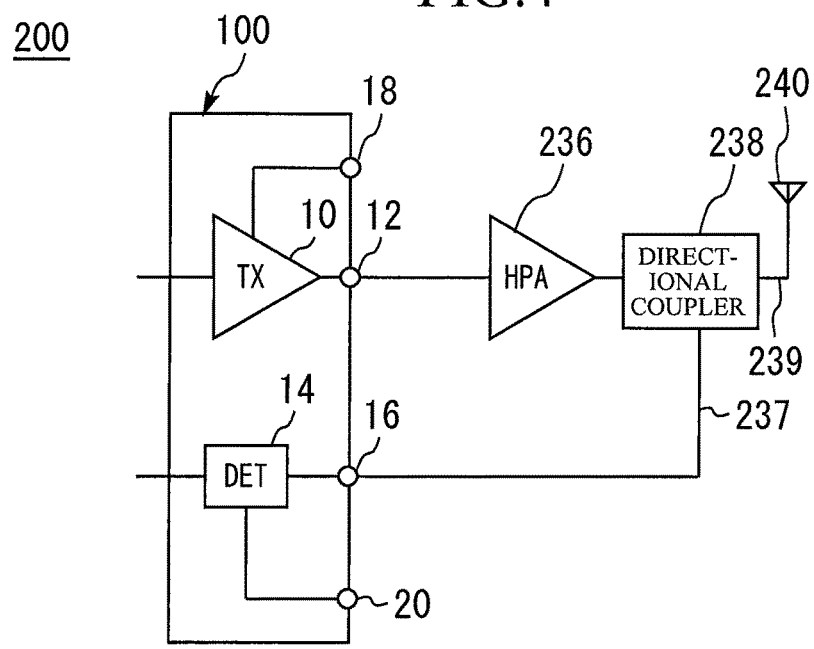
FIG. 4 is a circuit block diagram of a transmitter according to a second embodiment.

FIG. 4 is a circuit block diagram of a transmitter according to a second embodiment. A transmitter 200 according to the present embodiment is provided with the integrated circuit 100 described in the first embodiment. An input of an amplifier 236 is connected to the output terminal 12 of the integrated circuit 100. The amplifier 236 amplifies a millimeter wave signal outputted from the transmission circuit 10 to a power with which to transmit the millimeter wave signal from an antenna 240. The amplifier 236 is an HPA. The amplifier 236 may also be formed of GaAs.

An input of a directional coupler 238 is connected to an output of the amplifier 236. The directional coupler 238 can extract part of a propagating signal to another port. One output 239 of the directional coupler 238 is connected to the antenna 240. Another output 237 of the directional coupler 238 is connected to the detection terminal 16.

A millimeter wave signal outputted from the transmission circuit 10 is inputted to the amplifier 236. The millimeter wave signal is amplified by the amplifier 236 to the power with which to transmit the millimeter wave signal from the antenna 240. The millimeter wave signal outputted from the amplifier 236 is inputted to the directional coupler 238. The millimeter wave signal outputted from the output 239 of the directional coupler 238 is transmitted from the antenna 240. Power proportional to the power outputted from the antenna 240 is outputted from the output 237 of the directional coupler 238. The signal outputted from the output 237 is detected by the detector 14.

As described above, in the present embodiment, the directional coupler 238 allows the detector 14 to detect the output signal of the amplifier 236. Therefore, an output signal of the transmitter 200 can be tested using the detector 14. According to the present embodiment, the transmitter 200 can be formed by combining the integrated circuit 100 formed of silicon and the amplifier 236 formed of GaAs. Use of the amplifier 236 formed of GaAs can implement high output power and high efficiency.

When a testing circuit is incorporated in the integrated circuit, the testing circuit incorporated in the integrated circuit cannot test an output signal of an amplifier which is mounted outside. By contrast, in the present embodiment, the detector 14 can detect an output signal of the amplifier 236 provided outside the integrated circuit 100. Therefore, the detector 14 can test an output signal of the transmitter 200 formed by assembling the integrated circuit 100 and the amplifier 236. Therefore, the testing accuracy can be improved compared to the case where only testing of the integrated circuit is possible.

Third Embodiment

Figure 5:
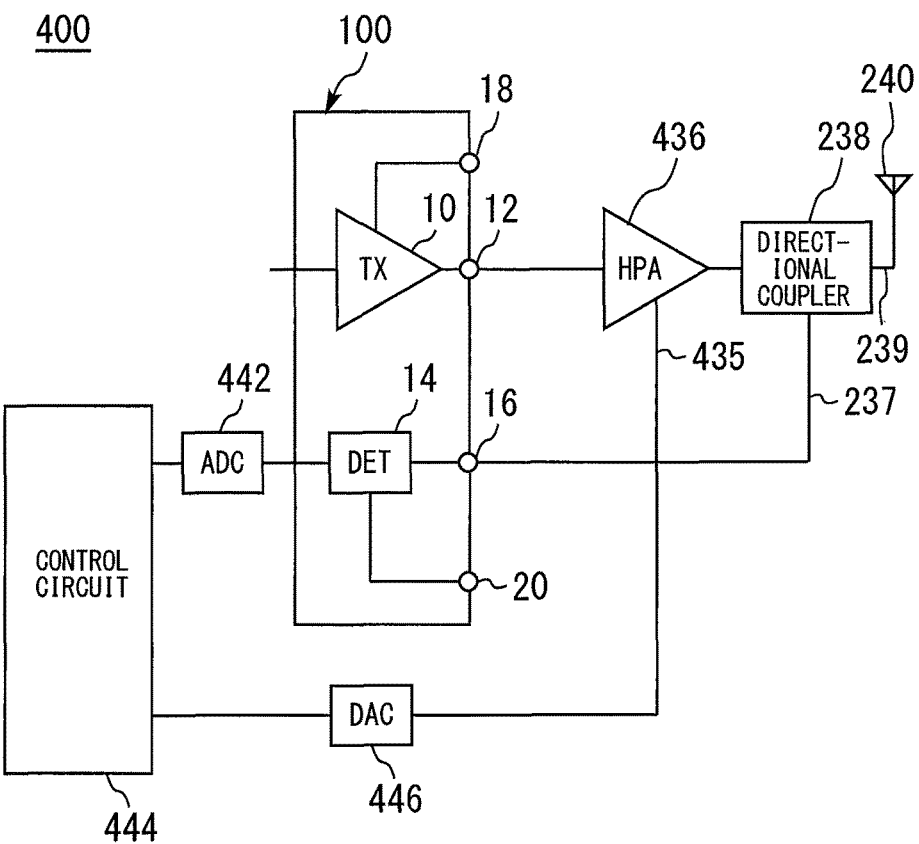
FIG. 5 is a circuit block diagram of a transmitter according to a third embodiment.

FIG. 5 is a circuit block diagram of a transmitter according to a third embodiment. A transmitter 400 according to the present embodiment is provided with the integrated circuit 100 described in the first embodiment. An input of an amplifier 436 is connected to the output terminal 12 of the integrated circuit 100. The amplifier 436 amplifies a millimeter wave signal outputted from the transmission circuit 10 to the power with which to transmit the millimeter wave signal from the antenna 240. The amplifier 436 is also provided with a power control terminal 435. The amplifier 436 is provided with a function of controlling gain according to a voltage inputted from the power control terminal 435.

As in the case of the second embodiment, an input of the directional coupler 238 is connected to an output of the amplifier 436. One output 239 of the directional coupler 238 is connected to the antenna 240. Another output of the directional coupler 238 is connected to the detection terminal 16.

An AD converter 442 is connected to an output of the detector 14. The AD converter 442 converts an output signal of the detector 14 to a digital signal. A control circuit 444 is connected to an output of the AD converter 442. The control circuit 444 processes the AD-converted digital signal. A DA converter 446 is connected to an output of the control circuit 444. The DA converter 446 generates a voltage to control the gain of the amplifier 436 according to the processing result of the control circuit 444. An output of the DA converter 446 is inputted to the power control terminal 435.

In the present embodiment, the detector 14 detects output power of the amplifier 436 as in the case of the second embodiment. The control circuit 444 carries out arithmetic processing on an output signal of the detector 14. The control circuit 444 outputs a signal to control the output power of the amplifier 436 according to the detection result of the detector 14. The processing result of the control circuit 444 is fed back to the amplifier 436. As a result, the amplifier 436 controls the gain. Therefore, the transmitter 400 according to the present embodiment can automatically control output power. For this reason, accurate power control is possible in response to an environmental variation such as temperature and supply voltage during operation of the transmitter 400.

As a modification of the present embodiment, the transmission circuit 10 may be provided with a function of controlling the gain. In this case, the transmission circuit 10 is provided with a power control terminal 435. The power control terminal 435 receives a voltage for controlling the gain from the DA converter 446. The transmission circuit 10 controls the gain according to the voltage inputted from the power control terminal 435.

Fourth Embodiment

Figure 6:
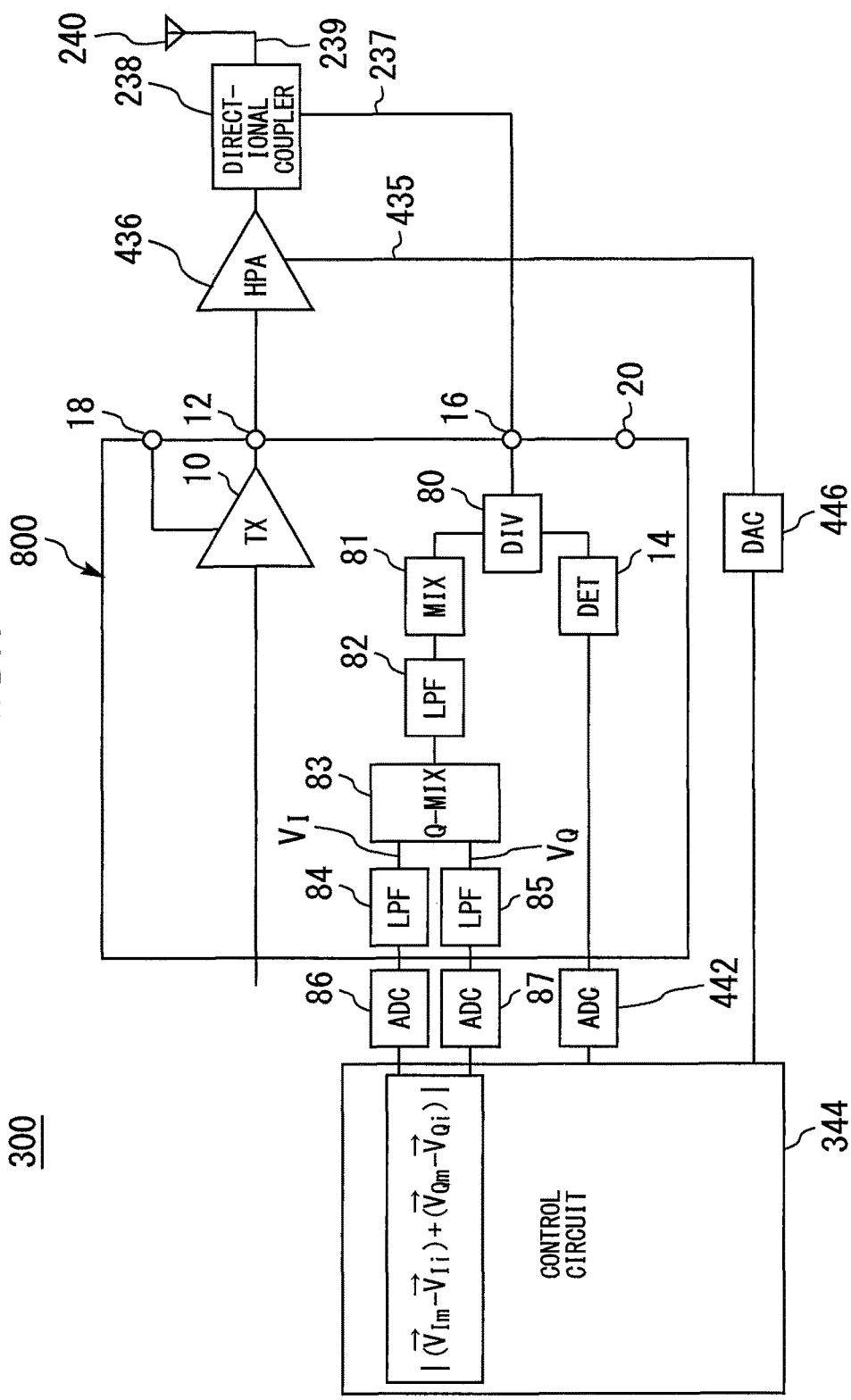
FIG. 6 is a circuit block diagram of a transmitter according to a fourth embodiment.

FIG. 6 is a circuit block diagram of a transmitter according to a fourth embodiment. A transmitter 300 according to the present embodiment is provided with an integrated circuit 800. In the integrated circuit 800, the structure of a detection section is different from that of the integrated circuit 100. The structure of the integrated circuit 800 except the detection section is similar to that of the integrated circuit 100. As in the case of the second embodiment, an input of the amplifier 436 is connected to the output terminal 12 of the integrated circuit 800. An input of the directional coupler 238 is connected to an output of the amplifier 436. One output 239 of the directional coupler 238 is connected to the antenna 240. Another output 237 of the directional coupler 238 is connected to the detection terminal 16.

In the integrated circuit 800, an input of a distributor 80 is connected to the detection terminal 16. The distributor 80 distributes a millimeter wave signal inputted from the detection terminal 16. The detector 14 that measures power of the millimeter wave signal is connected to one output of the distributor 80. An input of a mixer 81 is connected to another output of the distributor 80. The mixer 81 frequency-converts the millimeter wave signal to a first intermediate signal having a first intermediate frequency.

A low pass filter 82 is connected to an output of the mixer 81. The low pass filter 82 removes an unnecessary wave generated at the time of conversion to the first intermediate signal at the mixer 81. An output of the low pass filter 82 is connected to an input of a quadrature mixer 83. The quadrature mixer 83 converts the first intermediate signal to an in-phase signal $V_I$ and a quadrature signal $V_Q$. The in-phase signal $V_I$ and the quadrature signal $V_Q$ are signal vectors orthogonal to each other.

The in-phase signal $V_I$ is outputted from the integrated circuit 800 after passing through a low pass filter 84. The quadrature signal $V_Q$ is outputted from the integrated circuit 800 after passing through a low pass filter 85. The low pass filter 84 and the low pass filter 85 remove unnecessary waves generated at the time of conversion to the in-phase signal $V_I$ and the quadrature signal $V_Q$ at the quadrature mixer 83. The integrated circuit 800 is configured as shown above. In the present embodiment, the distributor 80, the detector 14, the mixer 81, the low pass filter 82, the quadrature mixer 83, the low pass filter 84 and the low pass filter 85 constitute a detection section.

Note that in the present embodiment, the frequency of a millimeter wave signal is reduced using the mixer 81 and the millimeter wave signal is inputted to the quadrature mixer 83. When the quadrature mixer 83 generates the in-phase signal $V_I$ and the quadrature signal $V_Q$, the higher the frequency of the signal inputted to the quadrature mixer 83, the higher is the possibility that the error may increase. Furthermore, the higher the frequency of the signal inputted to the quadrature mixer 83, the greater the variation between the gain on the in-phase side and the gain on the quadrature side may become. By providing the mixer 81, it is possible to reduce the error and the variation in gains when generating the in-phase signal $V_I$ and the quadrature signal $V_Q$.

The in-phase signal $V_I$ is inputted to an AD converter 86 after passing through the low pass filter 84. An output of the AD converter 86 is inputted to a control circuit 344. The quadrature signal $V_Q$ is inputted to an AD converter 87 after passing through the low pass filter 85. An output of the AD converter 87 is inputted to the control circuit 344. The AD converter 86 and the AD converter 87 convert the in-phase signal $V_I$ and the quadrature signal $V_Q$ to digital signals. The output of the detector 14 is inputted to an AD converter 442. An output of the AD converter 442 is inputted to the control circuit 344.

The control circuit 344 carries out vector calculation on the millimeter wave signal inputted from the detection terminal 16 using the in-phase signal $V_I$ and the quadrature signal $V_Q$ converted to digital signals. More specifically, the control circuit 344 calculates the norm of the millimeter wave signal inputted from the detection terminal 16 using the in-phase signal $V_I$ and the quadrature signal $V_Q$. Here, the norm is an absolute value of a signal vector. By calculating the norm, it is possible to detect power of the millimeter wave signal. Furthermore, the control circuit 344 carries out control calculations according to the calculated norm and outputs a signal to control the output power of the amplifier 436.

An output of the control circuit 344 is connected to the DA converter 446. The DA converter 446 generates a voltage to control the gain of the amplifier 436 according to the output signal of the control circuit 344. An output of the DA converter 446 is inputted to a power control terminal 435 of an amplifier 436.

Figure 7:
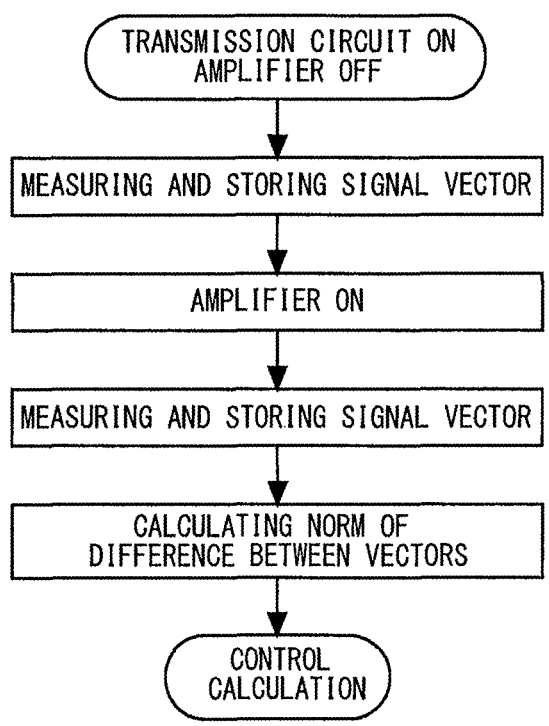
FIG. 7 is a flowchart illustrating the method of detecting power according to the fourth embodiment.

Next, a method for detecting output power of the transmitter 300 according to the present embodiment will be described. FIG. 7 is a flowchart illustrating the method of detecting power according to the fourth embodiment. A power supply to the transmission circuit 10 is started first and the transmission circuit 10 is activated. As a result, a millimeter wave signal is outputted from the output terminal 12. Next, the amplifier 436 is turned OFF. Here, the OFF state is a state in which the amplifier 436 is not operating. In this state, the detection section detects an input signal from the detection terminal 16.

When the amplifier 436 is in the OFF state, the signal inputted to the detection terminal 16 is a signal that leaks from the output terminal 12 to the detection terminal 16. The signal inputted from the detection terminal 16 is converted by the quadrature mixer 83 to an in-phase signal $V_{Ii}$ and a quadrature signal $V_{Qi}$. The in-phase signal $V_{Ii}$ and the quadrature signal $V_{Qi}$ are signal vectors orthogonal to each other. The in-phase signal $V_{Ii}$ and the quadrature signal $V_{Qi}$ are converted to digital values and stored in a storage provided in the control circuit 344. A vector sum $V_{Ii}+V_{Qi}$ of the in-phase signal $V_{Ii}$ and the quadrature signal $V_{Qi}$ measured when the amplifier 436 is in an OFF state corresponds to a signal vector $V_i$ which leaks from the output terminal 12 to the detection terminal 16.

Next, the amplifier 436 is set to an ON state. Here, the ON state is a state in which the amplifier 436 is operating. At this time, the amplifier 436 is set to a gain when the transmitter 300 is actually used. In this state, the detection section detects an input signal from the detection terminal 16. When the amplifier 436 is in the ON state, the signal inputted to the detection terminal 16 is a sum of a signal which leaks from the output terminal 12 to the detection terminal 16 and a signal inputted from the directional coupler 238 to the detection terminal 16.

The signal inputted from the detection terminal 16 is converted by the quadrature mixer 83 to an in-phase signal $V_{Im}$ and a quadrature signal $V_{Qm}$. The in-phase signal $V_{Im}$ and the quadrature signal $V_{Qm}$ are signal vectors orthogonal to each other. The in-phase signal $V_{Im}$ and the quadrature signal $V_{Qm}$ are converted to digital values and stored in the storage provided in the control circuit 344. A vector sum $V_{Im}+V_{Qm}$ of the in-phase signal $V_{Im}$ and the quadrature signal $V_{Qm}$ is designated as a signal vector $V_m$.

Next, the control circuit 344 calculates a norm of a difference between the signal vector $V_i$ measured by turning OFF the amplifier 436 and the signal vector $V_m$ measured by turning ON the amplifier 436. The norm of the difference between the vectors is obtained through a vector calculation of $|V_m-V_i|$. Here, $|V_m-V_i|$ is an absolute value of the signal vector $V_m-V_i$. Furthermore, $|V_m-V_i|=|(V_{Im}-V_{Ii})+(V_{Qm}-V_{Qi})|$.

Here, $V_{Im}-V_{Ii}$ is a signal vector obtained by subtracting the in-phase signal $V_{Ii}$ when the amplifier 436 is in an OFF state from the in-phase signal $V_{Im}$ when the amplifier 436 is in the ON state. Furthermore, $V_{Qm}-V_{Qi}$ is a signal vector obtained by subtracting the quadrature signal $V_{Qi}$ when the amplifier 436 is in the OFF state from the quadrature signal $V_{Qm}$ when the amplifier 436 is in the ON state. The vector $V_{Im}-V_{Ii}$ and the vector $V_{Qm}-V_{Qi}$ are orthogonal to each other.

From above, the norm $|V_m-V_i|$ of the signal vector $V_m-V_i$ is calculated. The norm $|V_m-V_i|$ corresponds to the magnitude of the signal obtained by subtracting the signal that leaks from the output terminal 12 to the detection terminal 16 from the signal inputted to the detection terminal 16. Therefore, by calculating the norm $|V_m-V_i|$, it is possible to detect the magnitude of the output signal from the antenna 240. Next, the norm $|V_m-V_i|$ is corrected.

First, power of the millimeter wave signal is measured using the detector 14. Here, power is measured in a gain region in which the magnitude of the signal which leaks from the output terminal 12 to the detection terminal 16 is sufficiently smaller than the sum of a decibel value of the gain of the amplifier 436 and a decibel value of the amount of coupling of the directional coupler 238. In such a gain region, influences of the signal which leaks from the output terminal 12 to the detection terminal 16 are smaller than influences of the signal inputted from the detection terminal 16. Therefore, the detector 14 can also measure power accurately.

Next, the control circuit 344 corrects the magnitude of the norm $|V_m-V_i|$ using the power measured by the detector 14. Next, the control circuit 344 performs control calculation using the corrected norm $|V_m-V_i|$ and outputs a signal to control the output power of the amplifier 436. The processing result of the control circuit 344 is fed back to the amplifier 436. As a result, the amplifier 436 controls the gain.

The value of isolation between the output terminal 12 and the detection terminal 16 may be a value approximate to the sum of a decibel value of the gain of the amplifier 436 and a decibel value of the amount of coupling of the directional coupler 238. Here, the value of isolation is a value corresponding to the magnitude of leakage of a signal between the output terminal 12 and the detection terminal 16. At this time, the signal that leaks from the output terminal 12 to the detection terminal 16 has a large effect on the detection result by the detector 14. For this reason, the detector 14 may not be able to detect power accurately. Especially, when performing gain control over a wide range, there is a possibility that a large control error may be generated in a part of the gain region.

In contrast, in the present embodiment, the detection section is provided with the quadrature mixer 83. The quadrature mixer 83 converts an input signal to the detection terminal 16 to the in-phase signal $V_I$ and the quadrature signal $V_Q$. By converting the input signal to the in-phase signal $V_I$ and the quadrature signal $V_Q$ which are orthogonal to each other, it is possible to perform vector calculation on the input signal to the detection terminal 16. Through the vector calculation, it is possible to subtract the signal that leaks from the output terminal 12 to the detection terminal 16 from the signal inputted to the detection terminal 16. This makes it possible to calculate the magnitude of the signal inputted from the directional coupler 238 to the detection terminal 16.

In the present embodiment, the control circuit 344 calculates the norm $|V_m-V_i|$ of the signal vector $V_m-V_i$. The norm $|V_m-V_i|$ corresponds to the magnitude of the signal outputted from the transmitter 300. Therefore, by calculating the norm $|V_m-V_i|$, the transmitter 300 can detect the magnitude of the output signal. From above, the transmitter 300 according to the present embodiment can detect power whose error caused by the leakage of a signal between terminals is corrected. This makes it possible to achieve more accurate testing.

The mixer 81, the low pass filters 82, 84 and 85 and the quadrature mixer 83 which are used in a high frequency region are generally affected by a variation in the semiconductor manufacturing step. For this reason, there is a possibility that an error may be produced in the magnitude of the norm $|V_m-V_i|$ obtained from the output signal from the mixer 81, the low pass filters 82, 84 and 85 and the quadrature mixer 83.

In contrast, the present embodiment can measure the absolute value of power using the detector 14. The detector 14 measures the absolute value of power in a gain region where there is less influence of the leakage of a signal between terminals. The magnitude of the norm $|V_m-V_i|$ is corrected using this power. It is thereby possible to obtain the norm $|V_m-V_i|$ whose error caused by a manufacturing variation is corrected. Therefore, it is possible to achieve more accurate testing.

Furthermore, in the present embodiment, the magnitude of the norm $|V_m-V_i|$ can be corrected inside the transmitter 300. For this reason, no special measuring instrument for a millimeter wave needs to be provided externally to correct the magnitude of the norm $|V_m-V_i|$. Therefore, the testing cost can be reduced.

In the present embodiment, a signal vector $V_i$ which leaks from the output terminal 12 to the detection terminal 16 is measured when the amplifier 436 is in an OFF state. As a modification, the signal vector $V_i$ may be measured while reducing the gain of the amplifier 436. In this case, the gain of the amplifier 436 is set so that the output signal from the directional coupler 238 becomes a level that does not affect the detection of the signal vector $V_i$.

In the modification, the norm $|V_m-V_i|$ of the difference between the vectors is calculated as in the case of the fourth embodiment. Here, $|V_m-V_i|=|(V_{Im}-V_{Ii})+(V_{Qm}-V_{Qi})|$. $V_{Im}-V_{Ii}$ is a signal vector obtained by subtracting the in-phase signal $V_{Ii}$ when the amplifier 436 is in a second state in which the gain is lower than that of a first state from the in-phase signal $V_{Im}$ when the amplifier 436 is in the first state. $V_{Qm}-V_{Qi}$ is a signal vector obtained by subtracting the quadrature signal $V_{Qi}$ when the amplifier 436 is in the second state in which the gain is lower than that of the first state from the quadrature signal $V_{Qm}$ when the amplifier 436 is in the first state.

In the present embodiment, the detection section is provided with the distributor 80, the mixer 83 and the detector 14. As a modification thereof, the detection section may not be provided with the detector 14 or the distributor 80. In this case, the magnitude of the norm $|V_m-V_i|$ is not corrected using the detector 14. This modification can simplify the structure of the transmitter 300. Note that the technical features described in the embodiments may be used in combination as appropriate.

The integrated circuit according to the first invention is provided with the output terminal and the detection terminal placed adjacent to each other. By connecting the output terminal and the detection terminal using the high frequency transmission line of the contact probe, it is possible to detect an output signal of the transmission circuit by the detection section and conduct testing. Furthermore, the first grounding wire and the second grounding wire are arranged around the first wire and the second wire through which a millimeter wave signal is transmitted. It is thereby possible to prevent the millimeter wave signal from leaking to the outside. Therefore, the testing accuracy of the integrated circuit can be improved.

The detection section according to the second invention is provided with the quadrature mixer and the detector. It is possible to calculate a norm of an input signal to the detection section from the output of the quadrature mixer. Furthermore, it is possible to correct the magnitude of the norm using the power measured by the detector. Therefore, the testing accuracy can be improved.

The method for testing the integrated circuit according to the third invention connects the output terminal and the detection terminal through the high frequency transmission line of the contact probe. In this way, it is possible to detect an output signal of the transmission circuit by the detection section and conduct testing. Furthermore, the first grounding wire and the second grounding wire are arranged around the first wire and the second wire through which the millimeter wave signal is transmitted. Furthermore, the first grounding terminal and the second grounding terminal are connected together by the third grounding wire provided around the high frequency transmission line. Thus, it is possible to prevent the millimeter wave signal from leaking to the outside. Therefore, the testing accuracy of the integrated circuit can be improved.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2016-173631, filed on Sep. 6, 2016 including specification, claims, drawings and summary, on which the Convention priority of the present application is based, are incorporated herein by reference in its entirety.

The invention claimed is:

1. An integrated circuit comprising:
    a transmission circuit that transmits a millimeter wave signal;
    a detection section that detects the millimeter wave signal;
    an output terminal connected to an output of the transmission circuit via a first wire;
    a detection terminal provided adjacent to the output terminal and connected to an input of the detection section via a second wire;
    a first grounding terminal provided adjacent to the output terminal and connected to the transmission circuit via a first grounding wire for grounding the transmission circuit; and
    a second grounding terminal provided adjacent to the detection terminal and connected to the detection section via a second grounding wire for grounding the detection section,
    wherein the first grounding wire and the second grounding wire are arranged around the first wire and the second wire.

2. The integrated circuit according to claim 1, wherein the detection section comprises a quadrature mixer.

3. The integrated circuit according to claim 2, wherein the detection section comprises a distributor that distributes the millimeter wave signal inputted from the detection terminal,
    a detector that measures power of the millimeter wave signal is connected to one output of the distributor, and
    the quadrature mixer is connected to another output of the distributor.

4. A transmitter comprising:
    the integrated circuit according to claim 1; and
    an amplifier connected to the output terminal to amplify the millimeter wave signal to a power with which to transmit the millimeter wave signal from an antenna.

5. The transmitter according to claim 4, further comprising a directional coupler, an input of which is connected to an output of the amplifier, one output of which is connected to the antenna and another output of which is connected to the detection terminal.

6. The transmitter according to claim 5, further comprising a control circuit that controls output power of the amplifier or the transmission circuit in accordance with an output signal of the detection section.

7. The transmitter according to claim 6,
    wherein the detection section comprises a quadrature mixer, and
    the control circuit calculates a norm of the millimeter wave signal inputted from the detection terminal from an in-phase signal and a quadrature signal outputted from the quadrature mixer and controls output power of the amplifier or the transmission circuit in accordance with the norm.

8. The transmitter according to claim 7, wherein the control circuit calculates the norm using a signal obtained by subtracting, from the in-phase signal when the amplifier is in a first state, the in-phase signal when the amplifier is in a second state in which the gain is lower than that in the first state, and a signal obtained by subtracting, from the quadrature signal when the amplifier is in the first state, the quadrature signal when the amplifier is in the second state.

9. The transmitter according to claim 8, wherein the second state is a state in which the amplifier is not operating.

10. The transmitter according to claim 8,
    wherein the detection section comprises a distributor that distributes the millimeter wave signal inputted from the detection terminal,
    a detector that measures power of the millimeter wave signal is connected to one output of the distributor,
    the quadrature mixer is connected to another output of the distributor, and
    the control circuit corrects the magnitude of the norm using the power measured by the detector.

11. A method for testing an integrated circuit, the integrated circuit comprising:
    a transmission circuit that transmits a millimeter wave signal;
    a detection section that detects the millimeter wave signal;
    an output terminal connected to an output of the transmission circuit via a first wire;
    a detection terminal provided adjacent to the output terminal and connected to an input of the detection section via a second wire;
    a first grounding terminal provided adjacent to the output terminal and connected to the transmission circuit via a first grounding wire for grounding the transmission circuit; and
    a second grounding terminal provided adjacent to the detection terminal and connected to the detection section via a second grounding wire for grounding the detection section,
    wherein the first grounding wire and the second grounding wire are arranged around the first wire and the second wire, the method comprising the steps of:
    connecting the output terminal and the detection terminal via a high frequency transmission line provided on a contact probe; and
    connecting the first grounding terminal and the second grounding terminal via a third grounding wire provided in the contact probe and provided around the high frequency transmission line.

* * * * *